(12) United States Patent
Shih

(10) Patent No.: US 12,142,596 B2
(45) Date of Patent: Nov. 12, 2024

(54) SEMICONDUCTOR STRUCTURE AND MANUFACTURING METHOD THEREOF

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 414 days.

(21) Appl. No.: 17/652,487

(22) Filed: Feb. 25, 2022

(65) Prior Publication Data
US 2023/0275066 A1    Aug. 31, 2023

(51) Int. Cl.
*H01L 25/065* (2023.01)
*H01L 21/48* (2006.01)
*H01L 23/00* (2006.01)
*H01L 23/498* (2006.01)
*H01L 25/00* (2006.01)
*H01L 25/18* (2023.01)

(52) U.S. Cl.
CPC ........ *H01L 25/0652* (2013.01); *H01L 21/486* (2013.01); *H01L 23/49827* (2013.01); *H01L 24/08* (2013.01); *H01L 24/80* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2225/06541* (2013.01); *H01L 2225/06548* (2013.01); *H01L 2225/06582* (2013.01); *H01L 2924/1431* (2013.01); *H01L 2924/1436* (2013.01); *H01L 2924/14511* (2013.01)

(58) Field of Classification Search
CPC ... H01L 25/0652; H01L 21/486; H01L 25/18; H01L 25/50; H01L 2224/08145; H01L 23/49827; H01L 24/08; H01L 24/80; H01L 2225/06541; H01L 2225/06548; H01L 2924/1431; H01L 2924/1436; H01L 2924/14511
See application file for complete search history.

(56) References Cited

U.S. PATENT DOCUMENTS

| | | | |
|---|---|---|---|
| 8,930,647 B1 | 1/2015 | Smith | |
| 8,947,931 B1 * | 2/2015 | D'Abreu | H01L 25/0652 365/185.11 |
| 9,106,229 B1 | 8/2015 | Hutton et al. | |
| 11,139,270 B2 * | 10/2021 | Manipatruni | H01L 25/0655 |

(Continued)

FOREIGN PATENT DOCUMENTS

| | | |
|---|---|---|
| TW | 201602900 A | 1/2016 |
| TW | 202103307 A | 1/2021 |

*Primary Examiner* — Thanh Y. Tran
(74) *Attorney, Agent, or Firm* — CKC & Partners Co., LLC

(57) ABSTRACT

A semiconductor structure includes an active interposer, a first stack chip module and a second stack chip module. The active interposer includes a substrate, a first control circuit located in a first control area of the substrate, a second control circuit located in a second control area of the substrate, and a communication circuit connected between the first control circuit and the second control circuit. The first stack chip module is stacked vertically on the first control area of the active interposer and the second stack chip module is stacked vertically on the second control area of the active interposer. In addition, a semiconductor structure manufacturing method is also disclosed herein.

12 Claims, 9 Drawing Sheets

(56) References Cited

U.S. PATENT DOCUMENTS

| | | | |
|---|---|---|---|
| 11,764,189 B2* | 9/2023 | Gao | H01L 24/08 257/774 |
| 2018/0286472 A1 | 10/2018 | Matsui et al. | |
| 2019/0079886 A1 | 3/2019 | Malladi et al. | |
| 2020/0365593 A1* | 11/2020 | Chen | H01L 25/0657 |

\* cited by examiner

SEMICONDUCTOR STRUCTURE AND MANUFACTURING METHOD THEREOF

BACKGROUND

Field of Invention

The present disclosure relates to a semiconductor structure and manufacturing method thereof.

Description of Related Art

The statements in this section merely provide background information related to the present disclosure and do not necessarily constitute prior art.

With the increasing density of electronic components, three dimensional circuit routing schemes have begun to be developed. In recent years, through silicon via (TSV) technology that connects an upper electronic device and a lower electronic device has flourished.

In addition, with the advance in electronic industry, there is an increasing demand for high-performance, high-speed and compact electronic components. To meet such a demand, packaging technologies are being recently developed to mount a plurality of semiconductor chips in a single package.

Recently, a demand for portable electronic devices is rapidly increasing in the market, and thus, it is necessary to reduce sizes and weights of electronic components provided in portable electronic devices. Therefore, there is a need to develop a technology capable of reducing a size of each component and a semiconductor package technology of integrating a plurality of components on a single package.

SUMMARY

According to some embodiments of the present disclosure, a semiconductor structure and manufacturing method thereof is provided. The semiconductor structure includes an active interposer, a first stack chip module and a second stack chip module. The active interposer includes a substrate, a first control circuit located in a first control area of the substrate, a second control circuit located in a second control area of the substrate, and a communication circuit connected between the first control circuit and the second control circuit. The first stack chip module is stacked vertically on the first control area of the active interposer and the second stack chip module is stacked vertically on the second control area of the active interposer.

In some embodiments, the first stack chip module includes a plurality of first stack chips stacked vertically on the first control area of the active interposer. The first stack chips are dynamic random access memory (DRAM) chips.

In some embodiments, the second stack chip module includes a plurality of second stack chips stacked vertically on the second control area of the active interposer. The second stack chips are NAND flash memory chips.

In some embodiments, the active interposer further includes a plurality of through silicon vias (TSVs) formed by via middle process.

In some embodiments, the semiconductor structure further includes an inactive interposer and the active interposer bonded on the inactive interposer.

In some embodiments, the semiconductor structure further includes a logic chip bonded on the inactive interposer.

In some embodiments, the logic chip is a central processing unit (CPU), a graphics processing unit (GPU) or a field programmable gate array (FPGA) chip.

In some embodiments, the first stack chip module and the second stack chip module are arranged parallel to the logic chip.

According to another aspect of the present disclosure, a semiconductor structure manufacturing method includes: providing an active interposer, in which the active interposer includes a substrate, a first control circuit located in a first control area of the substrate, a second control circuit located in a second control area of the substrate, and a communication circuit connected between the first control circuit and the second control circuit; bonding a first stack chip module vertically on the first control area of the active interposer; and bonding a second stack chip module vertically on the second control area of the active interposer.

In some embodiments, the semiconductor structure manufacturing method further includes vertically stacking a plurality of first stack chips on the first control area of the active interposer to form the first stack chip module.

In some embodiments, the first stack chips are dynamic random access memory (DRAM) chips.

In some embodiments, the semiconductor structure manufacturing method further includes vertically stacking a plurality of second stack chips on the second control area of the active interposer to form the second stack chip module.

In some embodiments, the second stack chips are NAND flash memory chips.

In some embodiments, the active interposer further includes a plurality of through silicon vias (TSVs) formed by via middle process.

In some embodiments, the semiconductor structure manufacturing method further includes dicing the active interposer to form a plurality of integrated memory chips.

In some embodiments, the semiconductor structure manufacturing method further includes bonding a logic chip and at least one of the integrated memory chips on an inactive interposer.

In some embodiments, the logic chip is a central processing unit (CPU), a graphics processing unit (GPU) or a field programmable gate array (FPGA) chip.

In some embodiments, the first stack chip module and the second stack chip module are arranged parallel to the logic chip.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
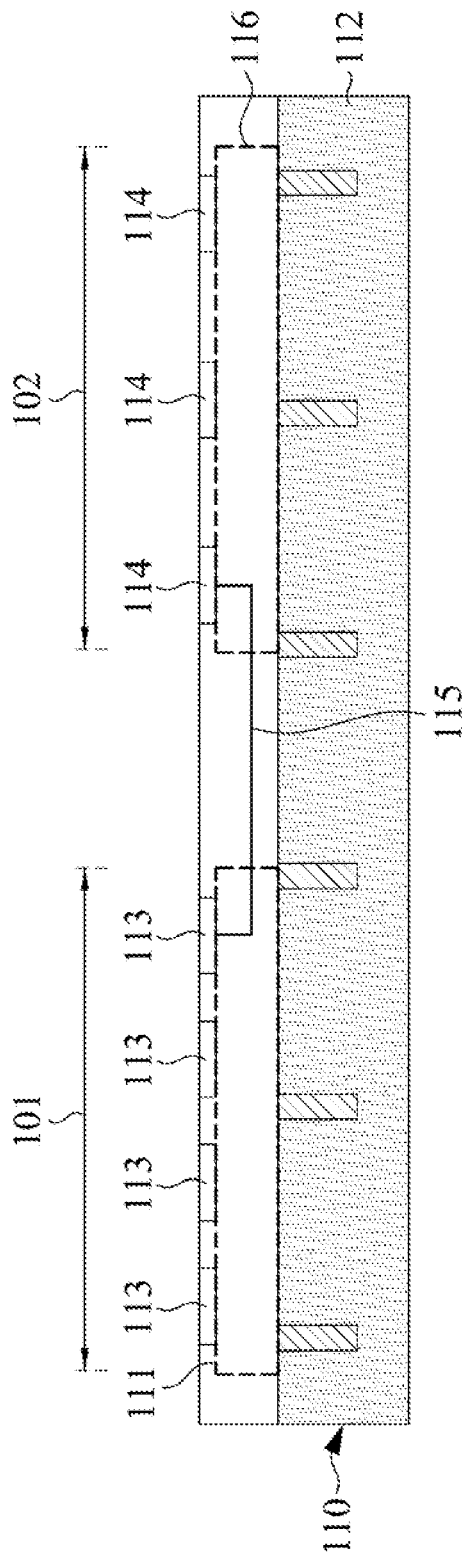
FIG. 1A to FIG. 7 are schematic cross-sectional views of an intermediate stage of forming the semiconductor structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 6:
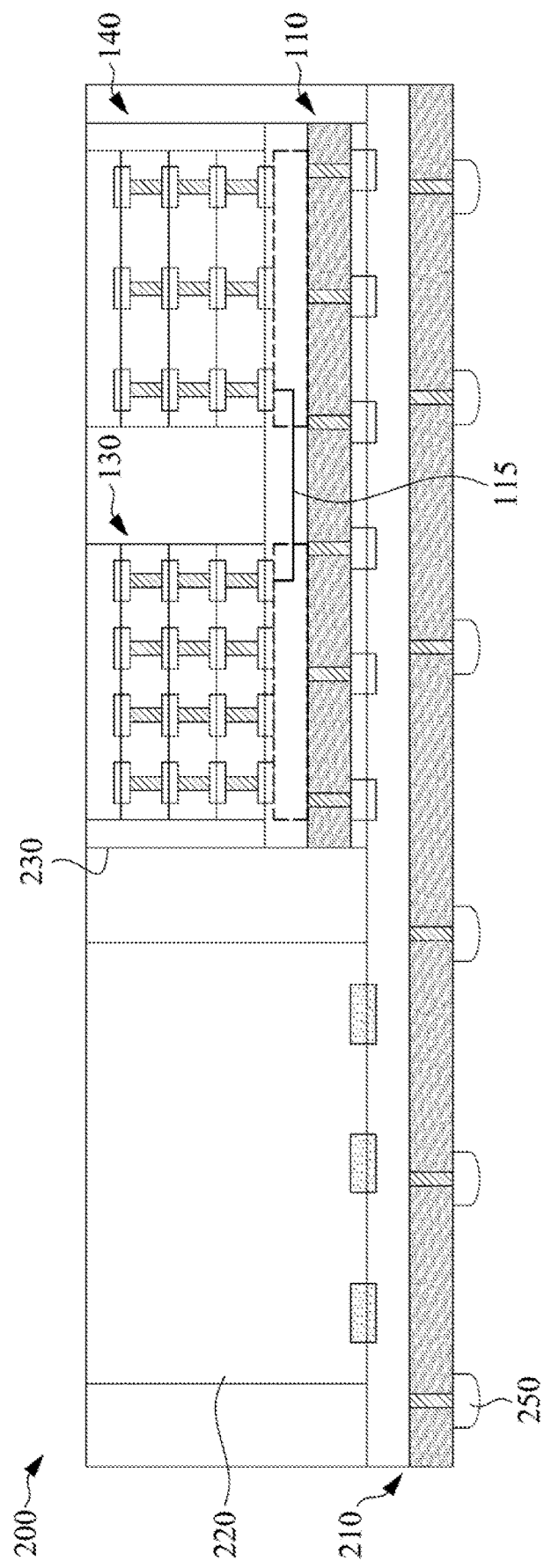
Figure 7:
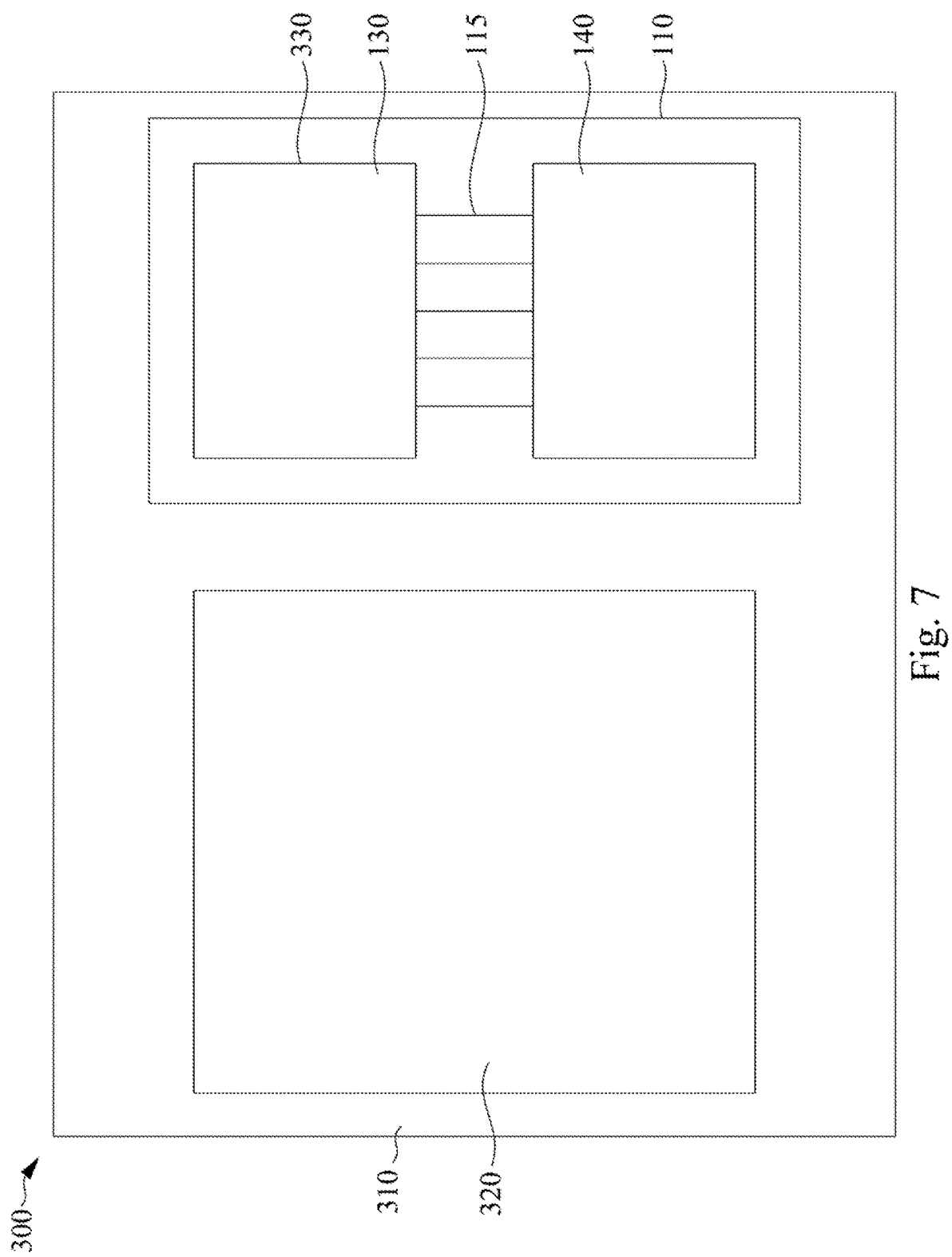
Figure 8:
FIG. 8 is a flow chart of a semiconductor structure manufacturing method according to some embodiments of the present disclosure.

Reference is made to FIGS. 1 to 8. FIGS. 1A to 7 are schematic cross-sectional views of intermediate stages of the semiconductor structure manufacturing method according to some embodiments of the present disclosure. FIG. 8 is a flow chart of a semiconductor structure manufacturing method according to some embodiments of the present disclosure.

Figure 1B:
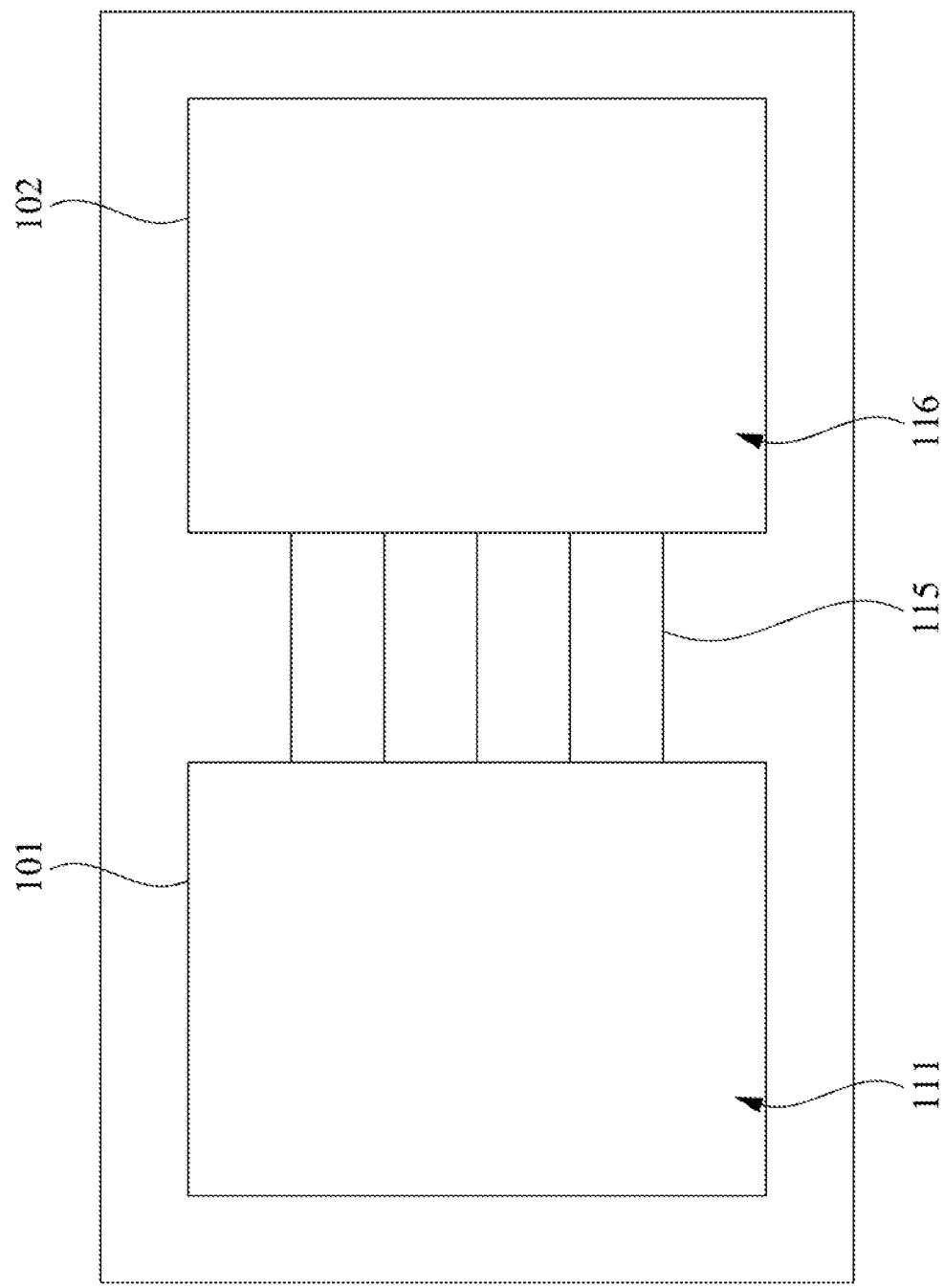

Referring to FIG. 8, the semiconductor structure manufacturing method 500 includes the following steps. First, in step 510, an active interposer 110 is provided, also referred to FIGS. 1A and 1B. FIG. 1A is a cross-sectional side view of the active interposer 110 and FIG. 1B is a cross-sectional top view of the active interposer 110.

In some embodiments, the active interposer 110 includes a substrate 112, a first control circuit 111 located in a first control area 101 of the substrate 112, a second control circuit 116 located in a second control area 102 of the substrate 112, and a communication circuit 115 connected between the first control circuit 111 and the second control circuit 116. The first control circuit 111, the second control circuit 116 and the communication circuit 115 are embedded in the substrate 112. In addition, a plurality of pads 113 are formed on the substrate 112 and located in the first control area 101, and a plurality of pads 114 are formed on the substrate 112 and located in the second control area 102.

In some embodiments, the active interposer 110 further includes a plurality of through silicon vias 117 (TSVs) formed by via middle process.

Figure 2:
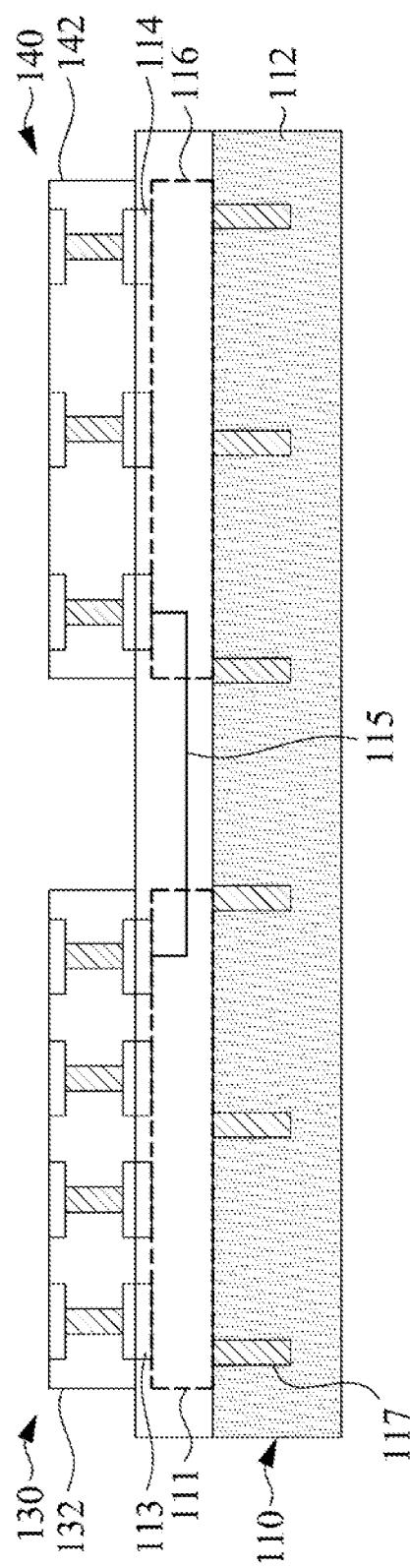
Figure 3:
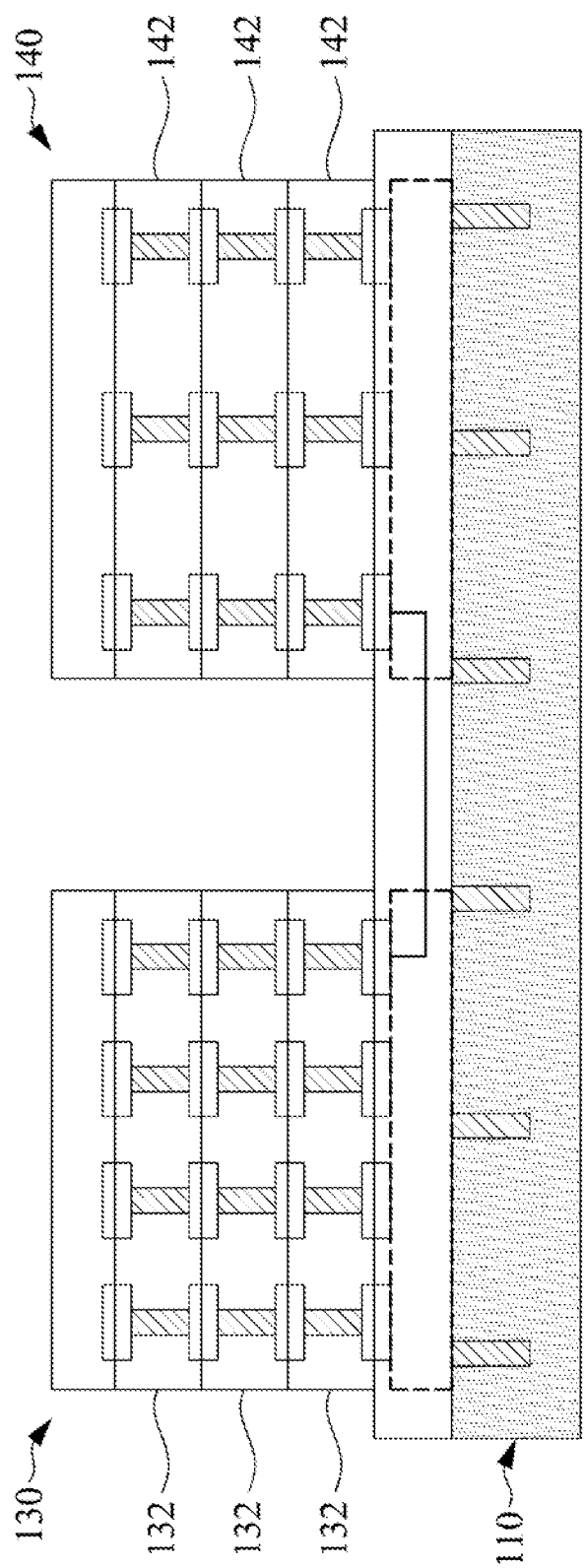

In step 520, a plurality of first stack chips 132 and a plurality of second stack chips 142 are multi stacked on the active interposer 110 by hybrid bonding process to form a first stack chip module 130 vertically located on the first control area 101 and a second stack chip module 140 vertically located on the second control area 102 respectively, also referred to FIGS. 2 and 3. In addition, the first control circuit 111 is utilized to control the first stack chips 132, the second control circuit 116 is utilized to control the second stack chips 142, and the communication circuit 115 in the active interposer 110 is utilized to communicate the first stack chips 132 and the second stack chips 142.

In some embodiments, the hybrid bonding process includes a plasma treatment prior to bonding the first stack chips 132, the second stack chips 142 and the active interposer 110. In addition, the first stack chips 132, the second stack chips 142 and the active interposer 110 are bonded under 400 degrees Celsius, preferably below 300 degrees Celsius. In some embodiments, the bumps and pads of the first stack chips 132, the second stack chips 142 and the active interposer 110 are bonded at 250 degrees Celsius. In some embodiments, the bumps and pads are made of Cu, SnAg, Au or Ni without departing from the scope or spirit of the present invention.

Figure 4:
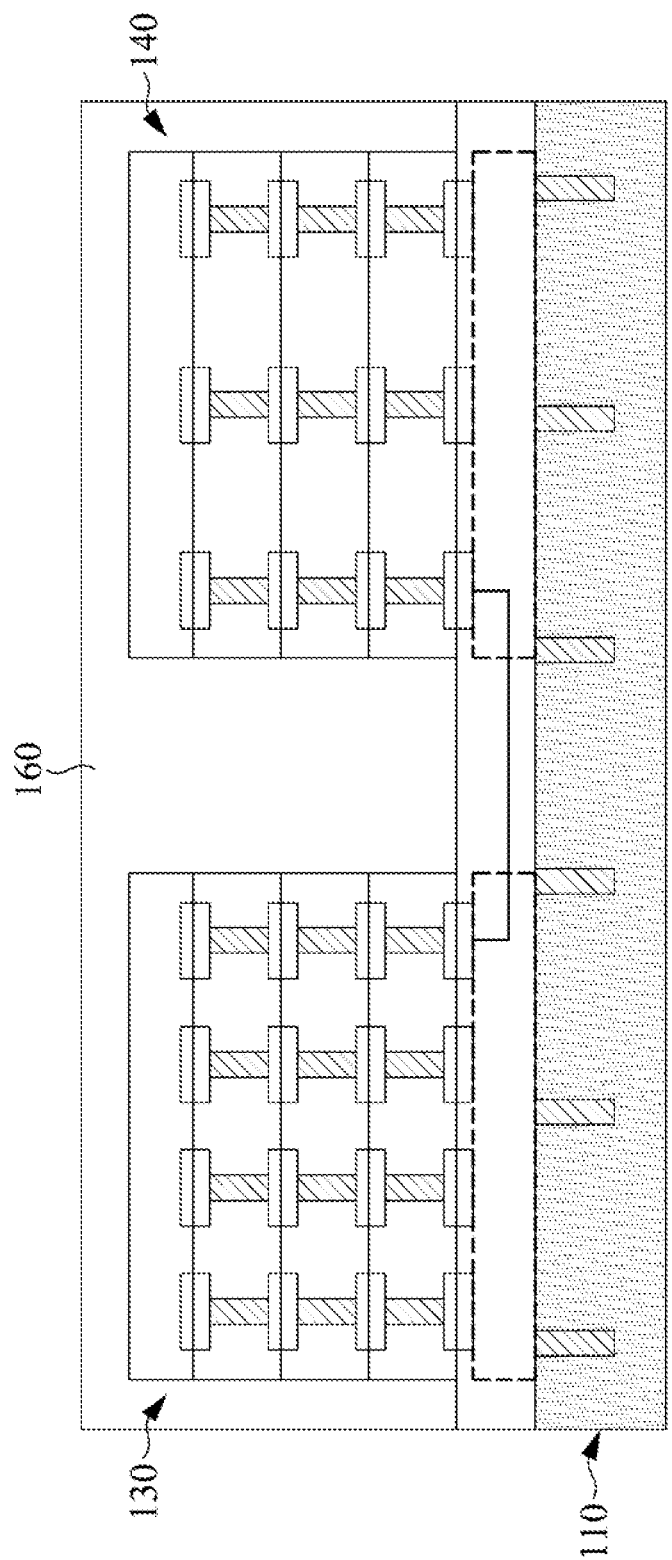
Figure 5:
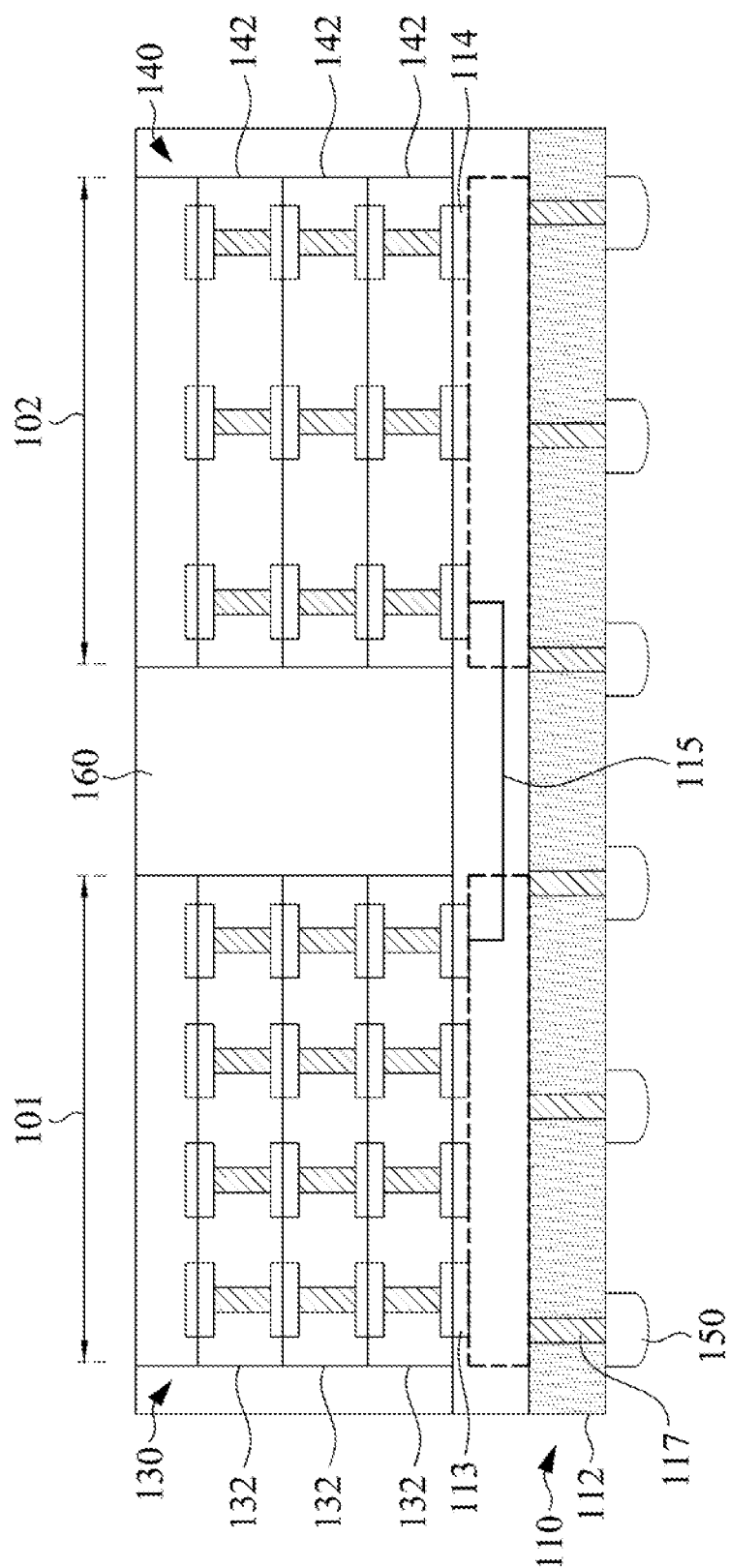

In step 520, the first stack chips 132 and the second stack chips 142 are molded on the active interposer 110 by a molding resin 160, for example, epoxy resin, also referred to FIG. 4.

In step 540, the molding resin 160 is ground to reduce the thickness of the semiconductor structure 100. In addition, in step 550, a backside of the active interposer 110 is processed through a wafer level backside process and bumps 150 are formed on the backside of the active interposer 110, also referred to FIG. 5.

In step 560, the semiconductor structure 100 is diced to form a plurality of chips. In some embodiments, the first stack chips 132 are dynamic random access memory (DRAM) chips, and the second stack chips 142 are NAND flash memory chips so that the semiconductor structure 100 is diced to form a plurality of integrated memory chips, i.e. the integrated memory chip 230, see FIG. 6. Each of the integrated memory chips includes at least one DRAM chip and at least one NAND flash memory chip.

Therefore, the semiconductor structure 100 includes an active interposer 110, a first stack chip module 130 and a second stack chip module 140. The active interposer 110 includes a substrate 112, a first control circuit 111 located in a first control area 101 of the substrate 112, a second control circuit 116 located in a second control area 102 of the substrate 112, and a communication circuit 115 connected between the first control circuit 111 and the second control circuit 116. The first stack chip module 130 is stacked vertically on the first control area 101 of the active interposer 110 and the second stack chip module 140 is stacked vertically on the second control area 102 of the active interposer 110. The first stack chip module 130 includes a plurality of first stack chips 132 stacked vertically on the first control area 101 of the active interposer 110 and the first stack chips are dynamic random access memory (DRAM) chips. The second stack chip module 140 includes a plurality of second stack chips 142 stacked vertically on the second control area 102 of the active interposer 110, and the second stack chips are NAND flash memory chips. The active interposer 110 further includes a plurality of through silicon vias (TSVs) formed by via middle process.

Furthermore, from steps 570 to step 600, please simultaneously refer to FIG. 6. In step 570, at least one integrated memory chip 230, manufactured by steps 510-560, and a logic chip 220 are bonded on an inactive interposer 210. Therefore, the active interposer 110 and the logic chip 220 are both bonded on the inactive interposer 210. In addition, the inactive interposer 210 has no control circuit therein.

In step 580, the integrated memory chip 230 and the logic chip 220 are molded on the inactive interposer 210. In step 590, the molding resin 260 is ground. In step 600, a backside of the inactive interposer 210 is processed through a wafer level backside process and bumps 250 are formed on the backside of the inactive interposer 210.

In some embodiments, the logic chip 220 is a central processing unit (CPU), a graphics processing unit (GPU) or a field programmable gate array (FPGA) chip.

Therefore, the semiconductor structure 200 further includes an inactive interposer 210 and a logic chip 220, and the active interposer 110 and the logic chip 220 are bonded on the inactive interposer 210.

Further refer to FIG. 7, in some embodiments, the semiconductor structure 300 includes an inactive interposer 310, an integrated memory chip 330 and an logic chip 320. The integrated memory chip 330 and the logic chip 220 are bonded and molded on the inactive interposer 210. It is worth noting that, the first stack chip module 130 and the second stack chip module 140 of the integrated memory chip 330 are arranged parallel to the logic chip 220. Referring to FIG. 6 and FIG. 7, the integrated memory chip 330 of FIG. 7 is the integrated memory chip 230 rotated by 90 degrees and bonded on the inactive interposer 210.

That is to say, the first stack chip module 130 and the second stack chip module 140 of the integrated memory chip 330 are both disposed beside and adjacent to the logic chip 220 to reduce the length of the communication circuit between the first stack chip module 130 and the logic chip 220 and the length of the communication circuit between the second stack chip module 140 and the logic chip 220. No second stack chip module 140 is located between the first stack chip module 130 and the logic chip 220, and no first stack chip module 130 is located between the second stack chip module 140 and the logic chip 220.

In summary, embodiments of the present disclosure provide a semiconductor structure and a semiconductor structure manufacturing method, in which the DRAM chip and the NAND flash memory chip are bonded on the active interposer to formed an integrated memory chip. Furthermore, the logic chip and the integrated memory chip can be further bonded on an inactive interposer, and the DRAM chip and the NAND flash memory chip are both disposed beside and adjacent to the logic chip so as to reduce the lengths of the communication circuits therebetween.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
   an active interposer comprising a substrate, a first control circuit located in a first control area of the substrate, a second control circuit located in a second control area of the substrate, and a communication circuit connected between the first control circuit and the second control circuit;
   a first stack chip module stacked vertically on the first control area of the active interposer;
   a second stack chip module stacked vertically on the second control area of the active interposer;
   an inactive interposer, wherein the active interposer is bonded on the inactive interposer; and
   a logic chip bonded on the inactive interposer, wherein the logic chip is a central processing unit (CPU), a graphics processing unit (GPU) or a field programmable gate array (FPGA) chip, the communication circuit between the first stack chip module and the second stack chip module is arranged parallel to the logic chip, and the first stack chip module and the second stack chip module are both disposed beside and adjacent to the logic chip.

2. The semiconductor structure of claim 1, wherein the first stack chip module comprises a plurality of first stack chips stacked vertically on the first control area of the active interposer.

3. The semiconductor structure of claim 2, wherein the first stack chips are dynamic random access memory (DRAM) chips.

4. The semiconductor structure of claim 3, wherein the second stack chip module comprises a plurality of second stack chips stacked vertically on the second control area of the active interposer.

5. The semiconductor structure of claim 4, wherein the second stack chips are NAND flash memory chips.

6. The semiconductor structure of claim 1, wherein the active interposer further comprises a plurality of through silicon vias (TSVs) formed by via middle process.

7. A semiconductor structure manufacturing method, comprising:
   providing an active interposer, wherein the active interposer comprises a substrate, a first control circuit located in a first control area of the substrate, a second control circuit located in a second control area of the substrate, and a communication circuit connected between the first control circuit and the second control circuit;
   bonding a first stack chip module vertically on the first control area of the active interposer;
   bonding a second stack chip module vertically on the second control area of the active interposer;
   dicing the active interposer to form a plurality of integrated memory chips; and
   bonding a logic chip and at least one of the integrated memory chips on an inactive interposer, wherein the logic chip is a central processing unit (CPU), a graphics processing unit (GPU) or a field programmable gate array (FPGA) chip, and the communication circuit between the first stack chip module and the second stack chip module is arranged parallel to the logic chip, and the first stack chip module and the second stack chip module are both disposed beside and adjacent to the logic chip.

8. The semiconductor structure manufacturing method of claim 7, further comprising vertically stacking a plurality of first stack chips on the first control area of the active interposer to form the first stack chip module.

9. The semiconductor structure manufacturing method of of claim 8, wherein the first stack chips are dynamic random access memory (DRAM) chips.

10. The semiconductor structure manufacturing method of claim 9, further comprising vertically stacking a plurality of second stack chips on the second control area of the active interposer to form the second stack chip module.

11. The semiconductor structure manufacturing method of claim 10, wherein the second stack chips are NAND flash memory chips.

12. The semiconductor structure manufacturing method of claim 7, wherein the active interposer further comprises a plurality of through silicon vias (TSVs) formed by via middle process.

\* \* \* \* \*